US007220319B2

(12) United States Patent
Sago et al.

(10) Patent No.: US 7,220,319 B2
(45) Date of Patent: May 22, 2007

(54) ELECTROSTATIC CHUCKING STAGE AND SUBSTRATE PROCESSING APPARATUS

(75) Inventors: Yasumi Sago, Tokyo (JP); Kazuaki Kaneko, Tokyo (JP); Takuji Okada, Tokyo (JP); Masayoshi Ikeda, Tokyo (JP); Toshihiro Tachikawa, Isehara (JP); Tadashi Inokuchi, Isehara (JP); Takashi Kayamoto, Isehara (JP)

(73) Assignee: Canon Anelva Corporation, Tokyo (JP)

( * ) Notice: Subject to any disclaimer, the term of this patent is extended or adjusted under 35 U.S.C. 154(b) by 150 days.

(21) Appl. No.: 10/413,136

(22) Filed: Apr. 15, 2003

(65) Prior Publication Data

US 2003/0222416 A1 Dec. 4, 2003

(30) Foreign Application Priority Data

Apr. 16, 2002 (JP) ............................ 2002-113563

(51) Int. Cl.
*H01L 21/00* (2006.01)
*C23C 16/00* (2006.01)

(52) U.S. Cl. ....................... 118/725; 118/724; 118/728; 361/234; 279/128; 156/345.53

(58) Field of Classification Search ........... 156/345.53; 361/234; 279/128; 204/192.1, 298.1; 118/725, 118/724, 728
See application file for complete search history.

(56) References Cited

U.S. PATENT DOCUMENTS 5,539,179 A 7/1996 Nozawa et al.
5,740,009 A 4/1998 Pu et al.
6,178,919 B1 * 1/2001 Li et al. .................. 118/723 E
6,209,480 B1 * 4/2001 Moslehi ................... 118/723 I
6,272,002 B1 * 8/2001 Mogi et al. ................. 361/234
6,490,146 B2 * 12/2002 Wang et al. ................ 361/234
6,503,368 B1 * 1/2003 Kholodenko et al. .. 156/345.51
6,535,371 B1 * 3/2003 Kayamoto et al. .......... 361/234
6,549,393 B2 * 4/2003 Kanno et al. ............... 361/234
6,756,132 B2 * 6/2004 Fujii et al. .................. 428/642

FOREIGN PATENT DOCUMENTS

JP 10041377 A * 2/1998
JP 10270540 A * 10/1998
JP 11-157953 6/1999

* cited by examiner

*Primary Examiner*—Ram N. Kackar
(74) *Attorney, Agent, or Firm*—Hogan & Hartson LLP

(57) ABSTRACT

This application discloses the structure of an ESC stage where a chucking electrode is sandwiched by a moderation layer and a covering layer. The moderation layer and the covering layer have the thermal expansion coefficients between the dielectric plate and the chucking electrode. This application also discloses the structure of an ESC stage where a chucking electrode is sandwiched by a moderation layer and a covering layer, which have internal stress directed oppositely to that of the chucking electrode. This application further discloses a substrate processing apparatus for carrying out a process onto a substrate as the substrate is maintained at a temperature higher than room temperature, comprising the electrostatic chucking stage for holding the substrate during the process.

18 Claims, 7 Drawing Sheets

ELECTROSTATIC CHUCKING STAGE AND SUBSTRATE PROCESSING APPARATUS

BACKGROUND OF THE INVENTION

1. Field of the Invention

This invention relates to an electrostatic chucking (ESC) stage for holding a board-shaped object such as a substrate, and a substrate processing apparatus comprising the ESC stage.

2. Description of the Related Art

The ESC stages for chucking substrates by electrostatic force are used widely in the field of substrate processing. In manufacturing electronic devices such as LSIs (Large-Scale Integrate circuits) and display devices such as LCDs (Liquid Crystal Displays), for example, there are many steps of processing substrates that are bases for products. In these steps, ESC stages are used for securing process uniformity and process reproducibility. Taking the plasma etching as an example, a substrate is etched, utilizing functions of ions and activated species produced in plasma. In this, an ESC stage is used for holding the substrate at an optimum position against the plasma.

Generally, an ESC stage comprises a chucking electrode to which voltage for chucking is applied, and a dielectric plate that is polarized by the voltage applied to the chucking electrode. The held substrate is in contact with the dielectric plate, and chucked by static electricity induced on the surface of the dielectric plate.

ESC stages are demanded to chuck substrates with making them stable. If a substrate is displaced or changes the posture on an ESC stage while a process is carried out, it might bring the problem of degrading the process uniformity and the process reproducibility. Thermal transformation and thermal expansion of an ESC stage could be critical in substrate processing in view of process homogeneity and process reproducibility. Temperatures of substrates during processes are often higher than room temperature. This is usually from process conditions, otherwise because of environments in process chambers in which processes are carried out. Anyway, when temperature of a substrate rises up, temperature of the ESC stage rises up as well. If thermal transformation or thermal expansion of the ESC stage takes place from the temperature rise, the held substrate might be transformed or displaced.

SUMMARY OF THE INVENTION

The invention of this application is to solve the above described subjects, and has the advantage of presenting a high-performance ESC stage capable of preventing transformation and displacement of a held substrate. Concretely, the invention presents the structure of an ESC stage where a chucking electrode is sandwiched by a moderation layer and a covering layer. The moderation layer and the covering layer have the thermal expansion coefficient between the dielectric plate and the chucking electrode. The invention also presents the structure of another ESC stage where a chucking electrode is sandwiched by a moderation layer and a covering layer, which have internal stress directed oppositely to that of the chucking electrode. This invention also presents a substrate processing apparatus for carrying out a process onto a substrate as the substrate is maintained at a temperature higher than room temperature, comprising an ESC stage for holding the substrate during the process.

DETAILED DESCRIPTION OF THE PREFERRED EMBODIMENTS

Figure 1:
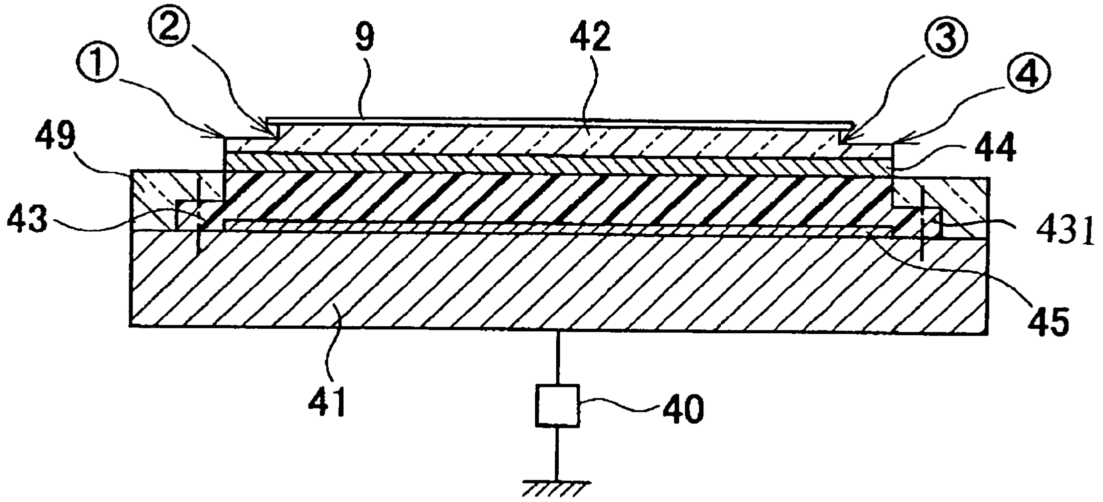
FIG. 1 is a schematic front cross-sectional view of the ESC stage as the embodiment of the invention.

The preferred embodiments of this invention will be described as follows. First, the ESC stage of the embodiment will be described. FIG. 1 is a schematic front cross-sectional view of the ESC stage of the embodiment. The ESC stage comprises a main body 41, a dielectric plate 42 on which an object 9 is chucked, and a chucking electrode 43 to which voltage for chucking is applied.

The ESC stage is table-like as a whole, and holds the board-shaped object 9 on the top surface. The main body 41 is made of metal such as aluminum or stainless-steel. The main body 41 is low column shaped. The chucking electrode 43 is fixed on the main body 41. As shown in FIG. 1, the chucking electrode 43 has a flange-shaped part 431 at bottom end. This part 431 is hereinafter called "electrode flange". The chucking electrode 43 is fixed on the main body 41 at the electrode flange 431 by screwing. The chucking electrode 43 is electrically shorted with the main body 41.

A protection ring 49 is provided, surrounding the screwed electrode flange 431. The protection ring 49 is made of insulator such as silicon oxide. The protection ring 49 is to protect the side of the chucking electrode 43 and the electrode flange 431 by covering them.

The dielectric plate 42 is located at the upside of the chucking electrode 43. As shown in FIG. 1, the chucking electrode 43 is formed of an upward convex part and a flange-like part surrounding the convex part. The dielectric plate 42 is almost the same in diameter as the chucking electrode 43.

A chucking power source 40 is connected with the above-described ESC stage. The type of the chucking power source 40 depends on that of the electrostatic chucking. The ESC stage of this embodiment is the mono-electrode type. A positive DC power source is adopted as the chucking power source 40. The chucking power source 40 is connected with the main body 41, applying the positive DC voltage to the chucking electrode 43 via the main body 41. The applied voltage to the chucking electrode 43 causes dielectric polarization, which enables to chuck the object 9. In this embodiment, because the positive DC voltage is applied, positive charges are induced on the surface of the dielectric plate 42, thereby chucking the object 9 electro-statically.

Two mechanisms of the electro-static chucking have been known. One is by Coulomb force, and the other one is by Johnson-Rahbeck force. Johnson-Rahbeck force is the chucking force generated by convergence of currents at micro-regions. The surfaces of the dielectric plate 42 and the objects 9 are microscopically uneven. Micro-protrusions on the both surfaces contact with each other. When the electrostatic charges are induced by the chucking power source 40, the flowing currents converge at the protrusions contacting with each other, thereby generating the Johnson- Rahbeck force. The Johnson-Rahbeck force is dominant in such an ESC stage as this embodiment. Still, the present invention is not limited to the one where the Johnson-Rahbeck force is dominant.

One of points greatly characterizing the ESC stage of this embodiment is in the structure where thermal displacement and thermal transformation of the object 9 are effectively prevented. This point will be described as follows. The ESC stage of this embodiment is supposedly used at a hot temperature environment. This would happen in case, for example, the object 9 is subjected to a test under a hot temperature environment, other than the case that the object 9 is a substrate to be processed, as described later. In the ESC stage of this embodiment, thermal displacement and thermal transformation are prevented even if it is used at a high-temperature environment.

Concretely, as shown in FIG. 1, a moderation layer 44 is provided between the dielectric plate 42 and the chucking electrode 43. The moderation layer 44 moderates difference of the thermal expansion coefficients between the dielectric plate 42 and the chucking electrode 43 so that thermal displacement and thermal transformation of the object 9 can be prevented. More concretely, the moderation layer 44 has an intermediate value of the thermal expansion coefficient between that of the dielectric plate 42 and that of the chucking electrode 43. "Intermediate value of the thermal expansion coefficient" just means: if the thermal expansion coefficient of the chucking electrode 43 is higher than the dielectric plate 42, then it is lower than the chucking electrode 43 and higher than the dielectric plate 42; and if the thermal expansion coefficient of the dielectric plate 42 is higher than the chucking electrode 43, then it is lower than the dielectric plate 42 and higher than the chucking electrode 43.

In this embodiment, specifically, the chucking electrode 43 is made of aluminum, and the dielectric plate 42 is made of magnesia (MgO). The moderation layer 44 is made of composite of ceramic and metal. As composite having the thermal expansion coefficient between aluminum and magnesia, we can name composite of silicon carbide and aluminum, which hereinafter called "SiC—Al composite". The thermal expansion coefficient of aluminum is $0.237\times10^{-4}$/K, and that of magnesia is $14\times10^{-6}$/K. In this case, the SiC—Al composite having the thermal expansion coefficient of about $10\times10^{-6}$/K is preferably chosen as material of the moderation layer 44. This kind of SiC—Al composite is manufactured by poring melting aluminum into porous SiC bulk and fill out it. The porous SiC bulk is prepared by the hot-temperature high-pressure sinter-molding of SiC powder. After cooling pored aluminum, the moderation layer 44 shaped as in Fin. 1 is obtained by such machine work as cutting. The volume opening ratio of the porous SiC—Al bulk is adjusted by choosing an adequate temperature and an adequate pressure in the sinter-molding, which enables to adjust the volume of filled aluminum. The volume opening ratio is obtained by comparing density of the porous bulk with that of a non-porous one of the same size. The thermal expansion coefficient of the SiC—Al composite manufactured in the described manner depends on the component ratio of aluminum against SiC. The described thermal expansion coefficient of $10\times10^{-6}$/K is obtained by adjusting the component ratio.

In addition in the ESC stage of this embodiment, a covering layer 45 is provided on the chucking electrode 43 at the opposite side to the moderation layer 44. In other words, the ESC stage has the structure where the chucking electrode 43 is sandwiched by the moderation layer 44 and the covering layer 45. The covering layer 45 is inserted between the chucking electrode 43 and the main body 41. This covering layer 45 is also made of material of which thermal expansion coefficient is between the dielectric plate 42 and the chucking electrode 43. This is enabled by adopting the same material as of the moderation layer 44. Still, different material may be adopted for the covering layer 45.

Figure 2:
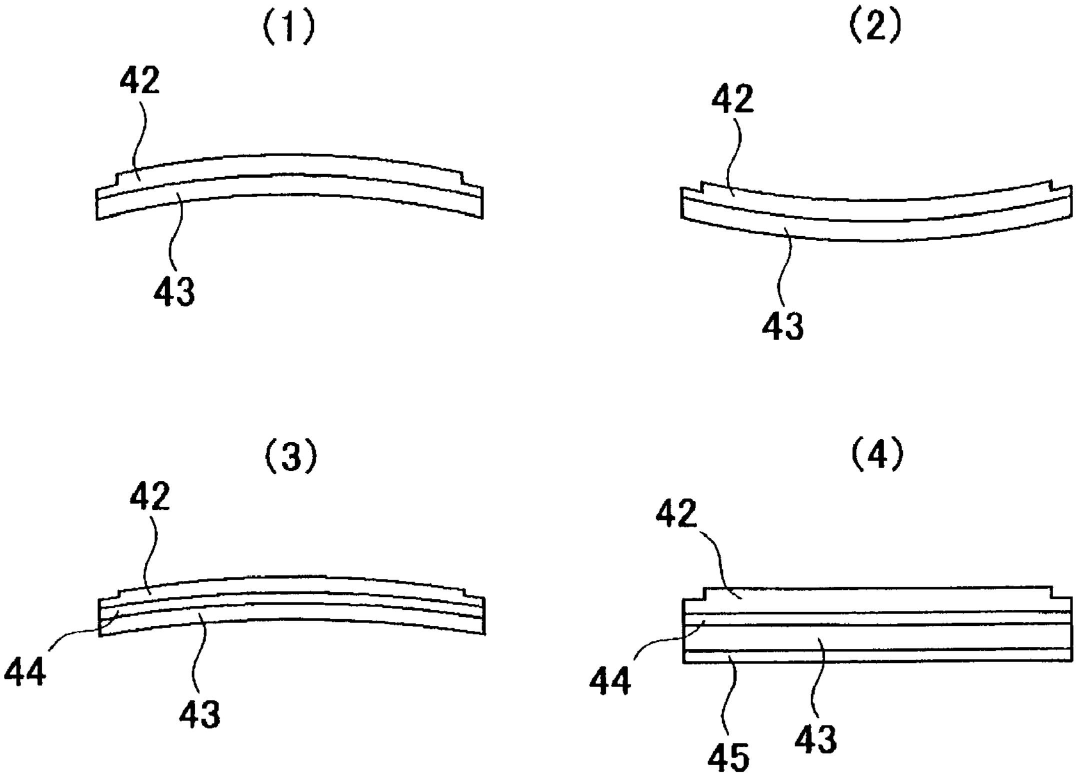
FIG. 2 schematically explains the advantage of the ESC stage shown in FIG. 1.

The structure where the chucking electrode 43 is sandwiched by the moderation layer 44 and the covering layer 45 having the in-between thermal-expansion-coefficient enables to prevent displacement and transformation of the chucked objected 9. This point will be described in detail as follows, referring FIG. 2. FIG. 2 schematically explains the advantage of the ESC stage shown in FIG. 1.

Generally, there is large difference of the thermal expansion coefficients between material of the chucking electrode, i.e. metal, and material of the dielectric plate 42, i.e. dielectric. In the prior-art structure where the dielectric plate 42 is fixed on the chucking electrode 43, when the ESC stage is heated up to a hot temperature, large transformation of the chucking electrode 43 would take place easily from its thermal expansion difference from the dielectric plate 42. As a result, the dielectric plate 42 would be also transformed to be convex as shown in FIG. 2(1), or to be concave as shown in FIG. 2(2). Such a transformation of the dielectric plate 42 would bring displacement or transformation of the object 9 being chucked.

In the prior-art structure where the moderation layer 44 having the in-between thermal-expansion-coefficient is inserted between the dielectric plate 42 and the chucking electrode 43, the difference of the thermal expansion coefficients is moderated, thereby suppressing transformation of the dielectric plate 42. From the research by the inventors, it has turned out that transformation of the dielectric plate 42 is further suppressed when a layer similar to the moderation layer 44 is provided at the opposite side in addition, as shown in FIG. 2(4). Though the reason of this has not been clarified completely, it is considered that thermal expansion at the both sides of the chucking electrode 43 would be in a balanced state when it is sandwiched by the layers having the in-between thermal-expansion-coefficients. It is further considered that internal-stress of the chucking electrode 43 would be balanced by the both-sides layers having the similar thermal expansion coefficients.

Respecting to thermal stress, it also could be considered that thermal stress within the moderation layer 44 and the covering layer 45 would function so as to restrain the transformation of the chucking electrode 43. For example, when the chucking electrode 43 would be transformed to be convex upward, internal thermal stress of the moderation layer 44 and the covering layer 45 could function so as to transform it in the opposite way, i.e. making it convex downward. In addition, it could take place that when compression stress is produced within the chucking electrode 43, tensile stress is produced within the moderation layer 44 and the covering layer 45. Inversely, compression stress could be produced within the moderation layer 44 and the covering layer 45 when tensile stress is produced within the chucking electrode 43. Generally, it can be expressed that the moderation layer 44 and the covering layer 45 could have stress opposite against stress within the chucking electrode 43. "Opposite" in this does not always mean that stress is directed completely to an opposite direction. Expressing by vectors, vectors of stress within the moderation layer 44 and the covering layer 45 make an angle over 90 degrees against the vector of stress within the chucking layer 43.

Anyway, provision of the covering layer 45 further restrains transformation of the chucking electrode 43 and the consequent transformation of the dielectric plate 42. As a result, displacement and transformation of the object 9 can be restrained as well. The point that the covering layer 45 has a similar thermal-expansion-coefficient does not means complete correspondence of the thermal expansion coefficient, but just means that the covering layer 45 is similar to the moderation layer 44 in view of having the in-between thermal-expansion-coefficient. Although, the same ceramic-metal composite as of the moderation layer 44, e.g. SiC-Al composite, may be employed as material of the covering layer 45. The composite for the covering layer 45 is conductive, having sufficient metal content. This is not to insulate the chucking electrode 43 from the main body 41.

Structure for fixing the dielectric plate 42 is also significant in view of restraining transformation of the dielectric plate 42. If the dielectric plate 42 is fixed locally, e.g. by screwing, thermal transformation of the dielectric plate 42 would be aggravated because it is in a state pinched at the fixation points and thermal conductivity is enhanced locally at the fixation points. In this embodiment, the dielectric plate 42 is in junction with the chucking electrode 43 by such brazing material as one of which main component is aluminum or indium. "Main component" here implies pure aluminum or pure indium, in addition to one including some additive. For example, the junction is performed by whole-surface brazing. Concretely, a thin sheet made of aluminum or indium is inserted between the dielectric plate 42 and the moderation layer 44. By cooling them after heating them up a required hot temperature, the dielectric plate 42 is fixed with the moderation layer 44. In this blazing, it is preferable that pressure ranging from 1 MPa to 2 MPa is mechanically applied with the heating at a temperature ranging from 570° C. to 590° C., in view of enhancing the thermal contact and the mechanical strength. Such the junction by brazing restrains transformation of the dielectric plate 42 further effectively. It is also practical to braze the moderation layer 44 and the chucking electrode 43, and to braze the chucking electrode 43 and the covering layer 45, in the same way. The dielectric plate 42 and the moderation layer 44 may be soldered by solder of which main component is tin or lead.

Next will be described the embodiment of the substrate processing apparatus of the invention. The apparatus of the present invention is to process a substrate, maintaining it at a temperature higher than room temperature. In the following description, a plasma etching apparatus is adopted as an example of substrate processing apparatuses. Also in the following description, "object" is replaced with "substrate" that is the sub-concept of it.

Figure 3:
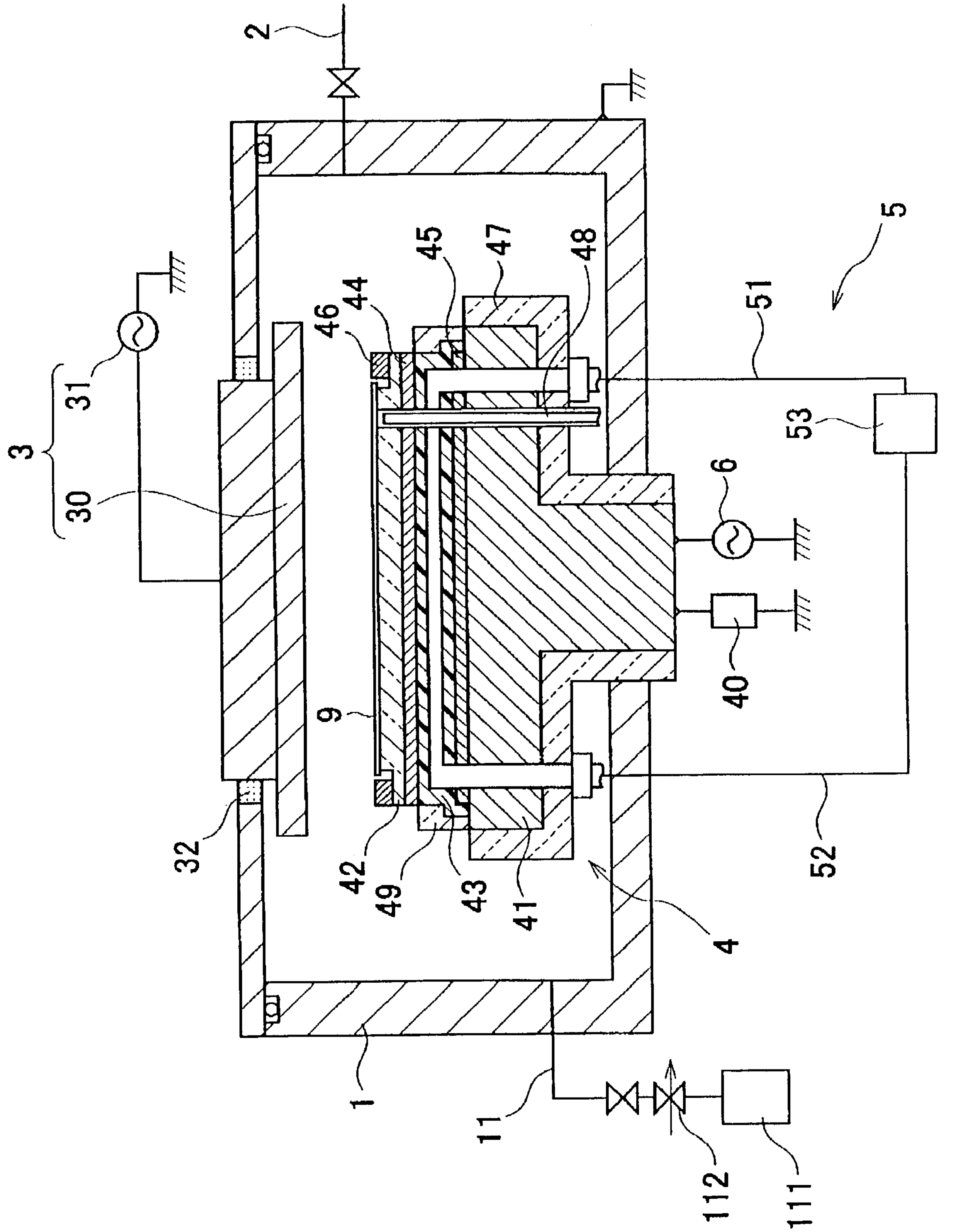
FIG. 3 is a schematic front cross-sectional view of the substrate processing apparatus as the embodiment of the invention.

FIG. 3 is a schematic front cross-sectional view of the substrate processing apparatus as the embodiment of the invention. The apparatus shown in FIG. 3 comprises a process chamber in which plasma etching is carried out onto the substrate 9, a process-gas introduction line 2 to introduce a process gas into the process chamber 1, a plasma generator 3 to generate plasma in the process chamber 1 by applying energy to the introduced process gas, and an ESC stage 4 to hold the substrate 9 by chucking it electro-statically at a position where the substrate 9 can be etched by a function of the plasma. The ESC stage 4 is almost the same as the described embodiment.

The process chamber is the air-tight vacuum vessel, which is pumped by a pumping line 11. The process chamber 1 is made of metal such as stain-less steel and electrically grounded. The pumping line 11 comprises a vacuum pump 111 such as dry pump and a pumping speed controller 112, thereby being capable of maintaining pressure in the process chamber 1 at 10–3 Pa to 10 Pa.

The process-gas introduction line 2 is capable of introducing the process gas for the plasma etching at a required flow-rate. In this embodiment, such a reactive gas as CHF3 is introduced into the process chamber 1 as the process gas. The process-gas introduction line 2 comprises a gas bomb filled with the process gas, and a feeding pipe interconnecting the gas bomb and the process chamber 1.

The plasma generator 3 generates the plasma by applying radio-frequency (RF) energy to the introduced process gas. The plasma generator 3 comprises an opposed electrode 30 facing to the ESC stage 4, and an RF power source 31 to apply RF voltage to the opposed electrode 30. The RF power source 31 is hereinafter called "plasma-generation source". Frequency of the plasma-generation source 31 ranges from 100 kHz to several tens MHz. The plasma-generation source 31 is connected with the opposed electrode 30 interposing a matching circuit (not shown). Output of the plasma-generation source 31 may range from 300 W to 2500 W. The opposed electrode 30 is installed air-tightly with the process chamber 1, inserting an insulator 32.

When the plasma-generation source 31 applies the RF voltage to the opposed electrode 30, an RF discharge is ignited with the introduced process gas by RF field provided in the process chamber 1. Through the discharge, the process gas transits to the state of plasma. In case the process gas is fluoride, ions and activated species of fluorine or fluoride are profusely produced in the plasma. Those ions and species reach the substrate 9, thereby etching the surface of the substrate 9.

Another RF power source 6 is connected with the ESC stage 4, interposing a capacitor. This RF power source 6 is to make ions incident onto the substrate 9 efficiently. This RF power source 6 is hereinafter called "ion-incidence source". When the ion-incidence source 6 is operated in the state the plasma is generated, self-biasing voltage is provided to the substrate 9. The self biasing voltage is negative DC voltage that is generated through the mutual reaction of the plasma and the RF wave. The self-biasing voltage makes ions incident onto the substrate 9 efficiently, thereby enhancing the etching rate.

In this embodiment, a correction ring 46 is provided with the ESC stage 4. The correction ring 46 is installed on the flange part of the dielectric plate 42, being flush with the substrate 9. The correction ring 46 is made of the same or similar material as the substrate 9, e.g. silicon mono-crystal. The correction ring 46 is to prevent non-uniformity or non-homogeneity of the process at the periphery on the substrate 9. Temperature on the substrate 9 tends to be lower at the periphery in comparison with the center, because of heat dissipation from the edge of the substrate 9. For solving this problem, the correction ring 46 made of the same or similar material as the substrate 9 is provided surrounding the substrate 9 to compensate the heat dissociation. The plasma is sustained by ions and electrons released from the substrate 9 during the etching as well. The plasma density tends to be lower at the space facing to the periphery of the substrate 9, because a less number of ions and electrons are released, compared to the center. When the correction ring 46 made of the same or similar material as the substrate 9 is provided surrounding it, amount of ions and electros supplied to the space facing the periphery of the substrate 9 is increased, thereby making the plasma more uniform and more homogeneous.

As described above, the ESC stage 4 comprises the protection ring 49. The protection ring 49 protects the side of the chucking electrode 43 and the electrode flange from the damage by the plasma or discharge. In case the substrate 9 is made of silicon, the silicon-oxide-made protection ring 49 reduces probability to contaminate the substrate 9 even if it is etched.

The ESC stage 4 is installed with the process chamber 1, inserting an insulator 47. The insulator 47 is made of material such as alumina, insulating the main body 41 from the process chamber 1 as well as protecting the main body 41 from the plasma. For preventing leakage of vacuum from the process chamber 1, vacuum seals such as O-rings are provided between the ESC stage 4 and the insulator 47, and between the process chamber 1 and the insulator 47.

The apparatus of this embodiment comprises a temperature controller 5 for controlling temperature of the substrate 9 during the process. As described, temperature of a substrate to be kept during a process, which is hereinafter called "optimum temperature", is often higher than room temperature. In the plasma etching, however, temperature of the substrate 9 easily exceeds the optimum temperature by receiving heat from the plasma. For solving this problem, the temperature controller 5 cools the substrate 9 and controls temperature of it at the optimum value during the etching.

As shown in FIG. 3, the chucking electrode 43 has a cavity in itself. The temperature controller 5 circulates coolant through the cavity to cool the chucking electrode 43, thereby cooling the substrate 9 indirectly. The cavity preferably has a complex configuration so that area for heat exchange by the coolant can be enlarged. For example, a cavity having complex uneven walls is formed by making a couple of cooling fin-plates face to each other with each fin staggered. The temperature controller 51 comprises a coolant feeding pipe 51 to feed the coolant into the cavity, a coolant drainage pipe 52 to drain the coolant out of the cavity, and a circulator 53 to circulate the coolant controlled at a required low temperature. As the coolant, Fluorinate (trademark of 3M Corporation) is employed, for example. The temperature controller 51 cools the substrate 9 at a temperature ranging from 80° C. to 90° C. by circulating the coolant of 30° C. to 40° C.

The substrate processing apparatus comprises a heat-transfer gas introduction line (not shown) to introduce a gas between the chucked substrate 9 and the dielectric plate 42. The heat-transfer gas introduction is to enhance heat transfer efficiency between the chucked substrate 9 and the dielectric plate 42. The back surface of the substrate 9 and the top surface of the dielectric plate 42 are not completely planar, but rough microscopically. Heat transfer efficiency is poor at spaces formed of the micro roughness on the surfaces, because those are at a vacuum pressure. The heat-transfer gas introduction line introduces a gas of high thermal conductivity, e.g. helium, into the spaces, thereby improving heat transfer efficiency.

The ESC stage 4 comprises lift pins 48 in the inside for accepting and releasing the substrate 9. The lift pins 48 are elevated by an elevation mechanism (not shown). Though only one lift pin 48 appears in FIG. 3, three lift pins 48 are provided actually.

Next will be described operation of the substrate processing apparatus of this embodiment. After a transfer mechanism (not shown) transfers the substrate 9 into the process chamber 1, the substrate 9 is placed on the ESC stage 4 by operation of the lift pins 48. With operation of the chucking power source 40, the substrate 9 is chucked on the ESC stage 4. The process chamber 1 has been pumped at a required vacuum pressure in advance. In this state, the process-gas introduction line 2 is operated to introduce the process gas at a required flow-rate. Then, the plasma-generation source 31 is operated, thereby generating the plasma. The etching is performed utilizing the plasma as described. The temperature controller 5 cools the substrate 9 at an optimum temperature. During the etching, the ion-incidence source 6 is operated for enhancing the etching efficiency. After performing the etching for a required period, operations of the process-gas introduction line 2, the plasma-generation source 31, and the ion-incidence source 6 are stopped. Then, operation of the chucking power source 40 is stopped, dissolving the chucking of the substrate 9. After the process chamber 1 is pumped again, the substrate 9 is transferred out of the process chamber 1 by the transfer mechanism.

In the substrate processing apparatus, though the chucking electrode 43 is heated higher than room temperature, its transformation is restrained by the moderation layer 44 and the covering layer as described. Therefore, transformation of the dielectric plate 42, and displacement or transformation of the substrate 9 caused thereby are restrained as well, Accordingly, the process uniformity and the process homogeneity are enhanced.

The advantage of the moderation layer 44 and the covering layer 45 to restrain the transformation is greatly remarkable in the structure where the correction ring 46 is provided. This point will be described in detail as follows. The correction ring 46 has the configuration essentially equivalent to extending the substrate 9 outward. Material of the correction ring 46 is the same as or similar to the substrate 9. The correction ring 46 is provided on the flange part of the dielectric plate 42, and chucked on it as well as the substrate 9. Probability and volume of transformation of the dielectric plate 42 would be greater at the flange part comparatively, because the flange part is thin and peripheral. If displacement or transformation of the correction ring 46 takes place from transformation of the dielectric part 42, the function to compensate heat dissociation from the edge of the substrate 9 would become out of uniform. Moreover, heat contact of the correction ring 46 onto the dielectric plate 42 would be worsened by the displacement or the transformation, resulting in that temperature of the correction ring 46 rises higher than the substrate 9. What is particularly serious is that the heat-contact deterioration of the correction ring 46 onto the dielectric plate happens randomly. The function of the correction ring 46 to heat the substrate 9 compensatively also becomes random when the heat-contact deterioration of the correction ring 46 becomes random. This leads to much deteriorating reproducibility of the temperature condition on the substrate 9 during the process.

In this embodiment, however, the correction ring 46 is hard to be transformed or displaced, because transformation and displacement of the dielectric plate 42 are restrained by suppressing transformation of the chucking electrode 43. Therefore, this embodiment is free from such the problems as non-uniformity and non-reproducibility of the substrate temperature.

Next will be described the result of an experiment for confirming the effect obtained from the structure of the embodiment. FIGS. 4 to 7 schematically show the result of this experiment. In this experiment, transformation and displacement of the surface of the dielectric plate 42 were measured under conditions of different temperatures or different temperature histories on the ESC stages. The transformation and the displacement are measured by a distance meter. Setting a reference level above the ESC stage, distance from each point on the surface of the dielectric plate 42 to the reference level is measured by the distance meter for detecting height of each point.

Figure 4:
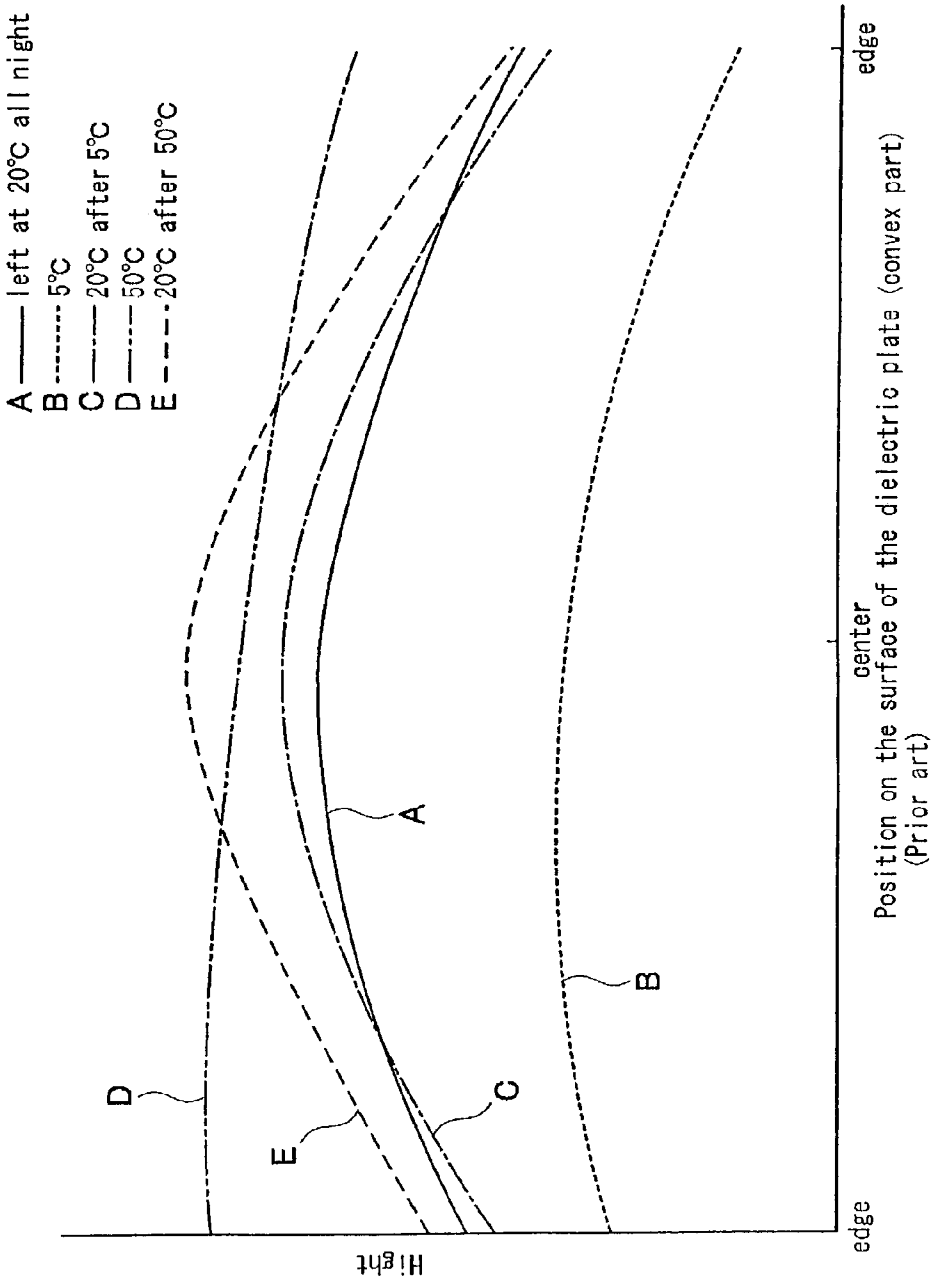
FIG. 4, FIG. 5, FIG. 6 and FIG. 7 schematically show the result of an experiment for confirming the effect obtained from the structure of the embodiment.
Figure 5:
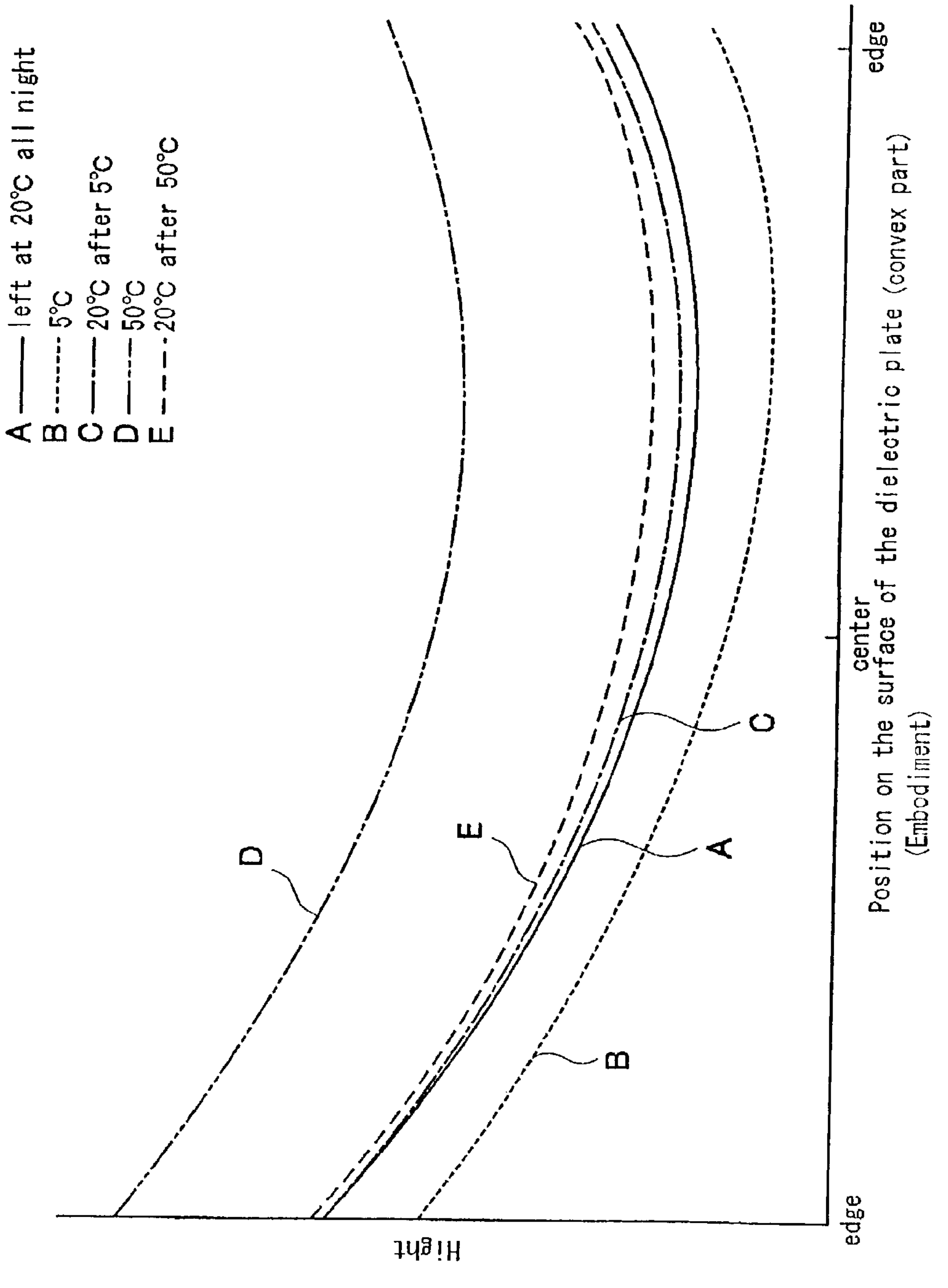
Figure 6:
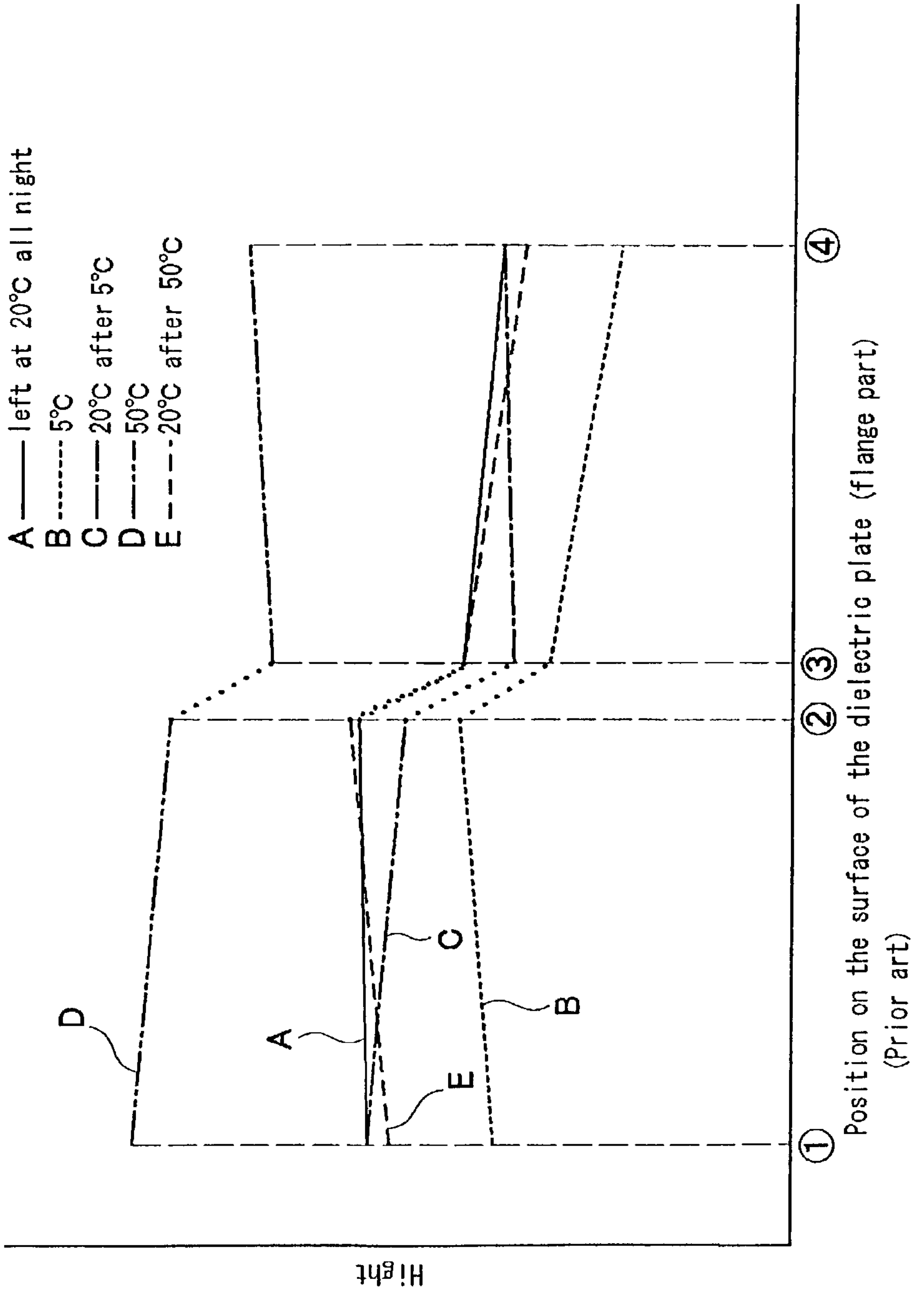
Figure 7:
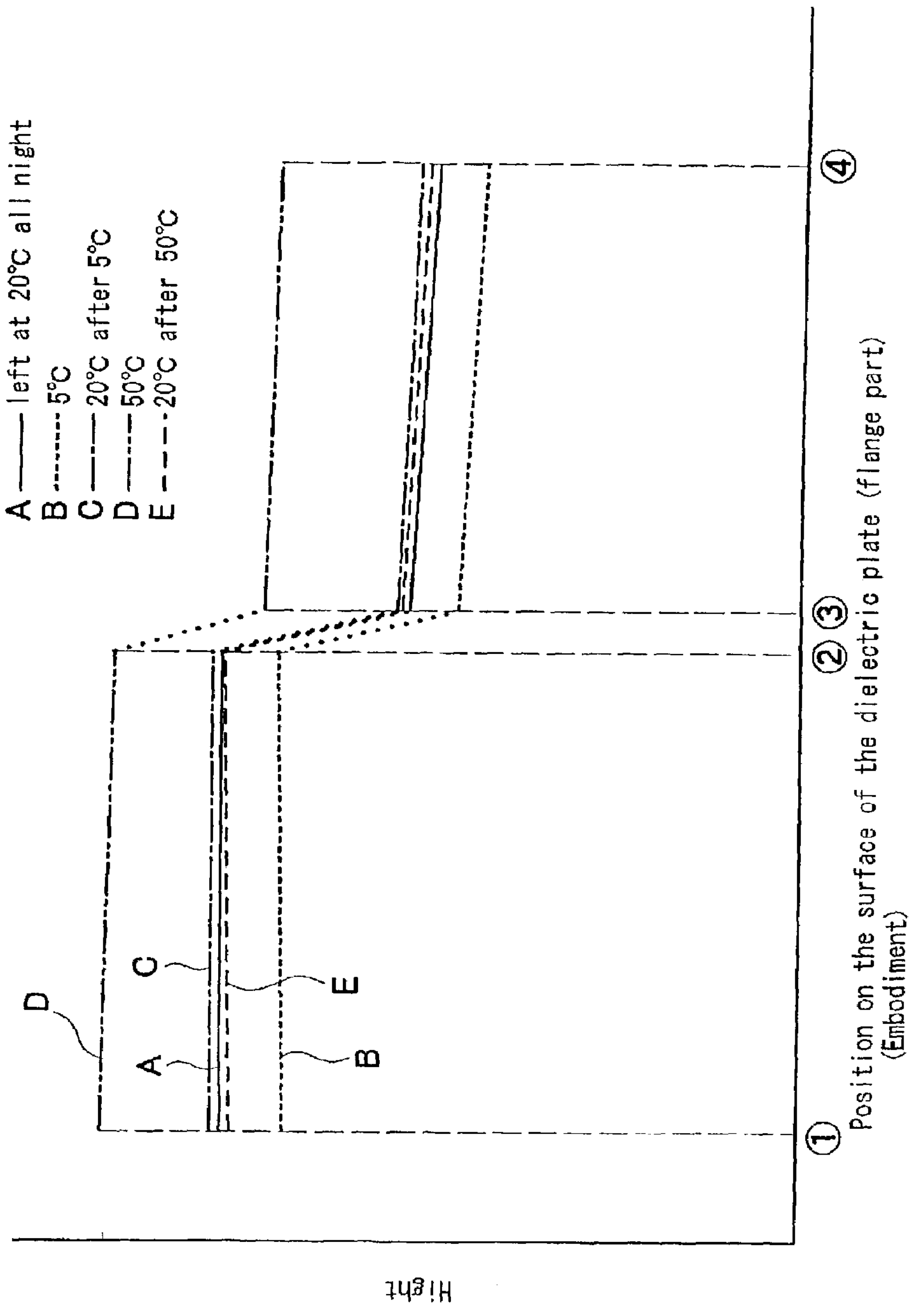

FIG. 4 and FIG. 5 both show heights of points on the surface of the convex part of the dielectric plate 42. FIG. 4 shows the heights in case of the prior-art ESC stage without the moderation layer 44 and the covering layer 45. FIG. 5 shows the heights in case of the ESC stage of the described embodiment with the moderation layer 44 and the covering layer 45. FIG. 6 and FIG. 7 both show heights of points on the surface of the flange part of the dielectric plate 42. FIG. 6 shows the heights in case of the prior-art ESC stage without the moderation layer 44 and the covering layer 45. FIG. 7 shows the heights in case of the ESC stage of the described embodiment with the moderation layer 44 and the covering layer 45. Location of each point on the flange part designated by ①, ②, ③, ④ in FIG. 6 and FIG. 7 is shown in FIG. 1 by the same ①, ②, ③, ④ respectively.

The experiment was carried out, varying temperature of the ESC stages. Temperature of an ESO stage is hereinafter called "stage temperature". In FIGS. 4 to 7, "A" designates data measured at the stage temperature of 20° C. after leaving the ESC stage at 20° C. for all night long. "B" designates data measured, keeping the stage temperature at 5° C. "C" designates data measured at the stage temperature of 20° C. after cooling the ESC stage at 5° C. "D" designates data measured, keeping the stage temperature at 50° C. "E" designates data measured, forcedly cooling the ESC stage at 20° C. after making the stage temperature 50° C. Though the ESC stage 4 comprises openings for interior members such as the lift pins 48, data at those openings are omitted in FIGS. 4 to 7.

Commonly in FIGS. 4 to 7, level of the dielectric plate 42 is higher when the stage temperature is higher. This results from thermal expansion of the whole ESC stage 4, being natural in a sense. What is the problem is that displacement or transformation of the dielectric plate 42 depends on values of the stage temperature or histories of the stage temperature.

Specifically, each line appearing in FIG. 5 is drawn through points on the surface of the dielectric plate 42, which is hereinafter called "surface level distribution". As shown in FIG. 5, the surface level distribution is elevated up and down, depending on the stage temperature or the history of the stage temperature, as it keeps the same figure. In short, it is displaced in parallel. This supposedly demonstrates the dielectric plate 42 has not been transformed and has performed the uniform thermal expansion. In FIG. 4, contrarily, the surface level distribution is elevated up and down as it changes the figure, depending on the stage temperature or the history of the stage temperature. In short, it is not displaced in parallel. This supposedly demonstrates transformation of the dielectric plate 42 has taken place. What is the problem in particular that the surface level distribution changes the figure, depending on the history of the stage temperature. As shown in FIG. 4, even in the measurements at the same stage temperature 20° C., the surface level distribution draws different curves in case it was left at 20° C. all night long and in case it was decreased by the forced cooling from 50° C.

The same analysis is applicable to the result at the flange part. As shown in FIG. 6, in case that the moderation layer 44 and the covering layer 45 are provided, the surface level distribution is elevated up and down, keeping the same figure. Contrarily, as shown in FIG. 7, in case that the moderation layer 44 and the covering layer 45 are not provided, the surface level distribution is elevated, changing the figure. Also at each different history of the stage temperature, the surface level distribution draws a different curve in FIG. 7.

The point that the surface level distribution depends on the temperature histories would bring a serious problem with respect to reproducibility of the substrate processing. Substrate processing apparatuses fabricated at manufactures' factories are installed into production lines and used after such works as delivery inspections. However, the temperature histories of the apparatuses until actual substrate processes are initially started are not the same among the apparatuses. Even the apparatuses performing the same processes almost always submit the different temperature histories through works such as delivery inspections in the manufactures' factories and test operations at the users' lines. Moreover, considering each by-piece process of substrates, a temperature history that the ESO stage has submitted until the process for a substrate is carried may differ from another temperature history that the ESO stage has submitted until the process for another substrate is carried out. For example, a temperature history that the ESC stage has submitted while the by-piece processes are continuingly carried out differs from another temperature history of the ESC stage that is initially used for the process of the first substrate. Such a situation happens, for example, when operation of the apparatus is resumed after suspension for the maintenance.

The point that the surface level distribution depends on the history of the stage temperature means that the substrate 9 would be transformed or displaced depending on the history, even if the ESC stage 4 is controlled at a constant temperature by the temperature controller 5. This could be the serious problem with respect to the process reproducibility. In case the moderation layer 44 and the covering layer 45 are provided, however, the surface level distribution does not depend on the history of the stage temperature, with no transformation and no displacement of the substrate 9. Therefore, processes with high reproducibility are enabled only by maintaining the ESC stage 4 at a required temperature.

More-detailed examples belonging to the embodiment will be described as follows.

EXAMPLE 1

Material of Chucking Electrode 43: Aluminum
Material of Dielectric Plate 42: Magnesia (MgO)
Fixation of Dielectric Plate 42: Brazing by Al at 550° C.
Material of Moderation Layer 44: SiC—Al composite
Thickness of Moderation Layer 44: 1.2 mm
Material of Covering Layer 45: SiC—Al composite
Thickness of Covering Layer 45: 1.2 mm
Chucking Voltage: 500V

EXAMPLE 2

Material of Chucking Electrode 43: Aluminum
Material of Dielectric Plate 42: Alumina ($Al_2O_3$)
Fixation of Dielectric Plate 42: Brazing by In at 120° C.
Material of Moderation Layer 44: SiC—Cu composite
Thickness of Moderation Layer 44: 1.2 mm
Material of Covering Layer 45: SiC—Cu composite
Thickness of Covering Layer 45: 1.2 mm
Chucking Voltage: 500V In the EXAMPLE 2, "SiC—Cu composite means composite" made of silicon carbide and cupper. Manufacture of this composite may be the same process as of the described SiC—Al composite. Magnesia is superior to alumina in erosion resistance. In case an erosive gas is used as in the etching, the dielectric plate 42 made of magnesia is more preferable. Size of the substrate 9 chucked by any one of the examples is, for example, 300 mm diameter.

Material of the moderation layer 44 and the covering layer 45 is not limited to described SiC—Al composite or SiC—Cu composite. It may be another composite of ceramic and metal. For instance, it may be composite of silicon carbide and nickel, composite of silicon carbide and Fe—Ni—Co alloy, composite of silicon carbide and Fe—Ni alloy, composite of silicon nitride ($Si_3N_4$) and nickel, or composite of silicon nitride and Fe—Ni alloy. Moreover, material of moderation layer 44 and the covering layer 45 is not limited to composite of ceramic and metal. What is required is only that it has the thermal expansion coefficient between the chucking electrode 43 and the dielectric plate 42.

There are several types of electrostatic chucking such as the bi-electrode type and the multi-electrode type, in addition to the described mono-electrode type. The bi-electrode type comprises a couple of chucking electrodes, to which voltages of opposite polarity to each other are applied. The multi-electrode type comprises multiple couples of chucking electrodes, applying voltages of opposite polarity to each electrode of each couple. In these types, the chucking electrodes may be buried within the dielectric plate 42. In case of the mono-electrode type, negative DC voltage may be applied for chucking. The present invention is also enabled in these types. Though the described ESC stage chucks the object or substrate 9 on the top surface, it may be overturned, i.e. chucking the object or substrate 9 at the bottom surface. Moreover, the ESC stage may chuck the object or substrate 9 on the side surface, making it uprightly.

Though the plasma etching apparatus was adopted as the example of substrate processing apparatuses in the above description, the present invention is enabled for other apparatuses such as plasma chemical vapor deposition (CVD) apparatuses and sputtering apparatuses. The temperature controller 5 may heat the substrate 9 and maintain it at a required temperature. There are many other applications of the ESC stage than substrate processing, for example a test of an object such as an environmental testing apparatus.

What is claimed is:

1. An electrostatic chucking stage for electro-statically chucking an object, comprising:

a dielectric plate on which the object is chucked;

a chucking electrode to which voltage for dielectrically polarizing the dielectric plate is applied;

a moderation layer provided between the dielectric plate and the chucking electrode, and having a thermal expansion coefficient between a thermal expansion coefficient of the dielectric plate and a thermal expansion coefficient of the chucking electrode;

a covering layer provided on the chucking electrode at a side opposite to the dielectric plate so that the chucking electrode is sandwiched by the moderation layer and the covering layer, said covering layer having a thermal expansion coefficient between the thermal expansion coefficient of the dielectric plate and the thermal expansion coefficient of the chucking electrode; and wherein the moderation layer and the covering layer have structures comprising metal filled into porous bulks made of ceramic, wherein the thermal expansion coefficients of the moderation layer and the covering layer are obtained by adjusting volume opening ratios of the porous bulks, wherein the chucking electrode has a flange part at a periphery thereof and is fixed to a metallic main body by screwing at the flange part, and the covering layer is inserted between the chucking electrode and the main body in an interfacial recess inner to the flange part, wherein the moderation layer and the covering layer are separated so as not to cover an end of the electrode, and wherein the electrode and the metallic main body are electrically conducted through the metal filled into the porous ceramic of the covering layer to apply the voltage for chucking without a connecting line through the covering layer.

2. An electrostatic chucking stage for electro-statically chucking an object as claimed in claim 1, wherein the dielectric plate is made of magnesia, the chucking electrode is made of aluminum, and the moderation layer and the covering layer are made of composite of aluminum and ceramic.

3. An electrostatic chucking stage for electro-statically chucking an object as claimed in claim 2, wherein the dielectric plate and the moderation layer are brazed with a brazing material containing aluminum as a main component.

4. An electrostatic chucking stage for electro-statically chucking an object as claimed in claim 2, wherein the dielectric plate and the moderation layer are soldered with solder containing tin as a main component.

5. An electrostatic chucking stage for electro-statically chucking an object as claimed in claim 2, wherein the dielectric plate and the moderation layer are soldered with solder containing lead as a main component.

6. An electrostatic chucking stage for electro-statically chucking an object as claimed in claim 1, wherein the dielectric plate is made of alumina, the chucking electrode is made of aluminum, and the moderation layer and the covering layer are made of composite of aluminum and ceramic.

7. An electrostatic chucking stage for electro-statically chucking an object as claimed in claim 6, wherein the dielectric plate and the moderation layer are brazed with a brazing material containing indium as a main component.

8. A substrate processing apparatus for processing onto a substrate as the substrate is maintained at a temperature higher than room temperature, comprising an electrostatic chucking stage as claimed in claim 1 for holding the substrate during process.

9. A substrate processing apparatus as claimed in claim 8, comprising a plasma generator for generating plasma at a space facing the substrate, wherein the process utilizes the plasma.

10. An electrostatic chucking stage for electro-statically chucking an object, comprising:

a dielectric plate on which the object is chucked;

a chucking electrode to which voltage for dielectrically polarizing the dielectric plate is applied;

a moderation layer provided between the dielectric plate and the chucking electrode, and having a thermal expansion coefficient between a thermal expansion coefficient of the dielectric plate and a thermal expansion coefficient of the chucking electrode, said moderation layer having a peripheral side open for thermal expansion without being covered by the dielectric plate;

a covering layer provided on the chucking electrode at a side opposite to the moderation layer so that the chucking electrode is sandwiched by the moderation layer and the covering layer, said covering layer having a thermal expansion coefficient between the thermal expansion coefficient of the dielectric plate and the thermal expansion coefficient of the chucking electrode; and a protection ring surrounding a peripheral side of the chucking electrode, and being provided separately from the dielectric plate and the moderation layer, wherein the moderation layer and the covering layer have structures comprising metal filled into porous bulks made of ceramic, wherein the thermal expansion coefficients of the moderation layer and the covering layer are obtained by adjusting volume opening ratios of the porous bulks, wherein the chucking electrode has a flange part at a periphery thereof and is fixed to a metallic main body by screwing at the flange part, and the covering layer is inserted between the chucking electrode and the main body in an interfacial recess inner to the flange part, wherein the moderation layer and the covering layer are separated so as not to cover an end of the electrode and so as to allow the electrode thermally expand at the end thereof, and wherein the electrode and the metallic main body are electrically conducted through the metal filled into the porous ceramic of the covering layer to apply the voltage for chucking without a connecting line through the covering layer.

11. An electrostatic chucking stage for electro-statically chucking an object as claimed in claim 10, wherein the dielectric plate is made of magnesia, the chucking electrode is made of aluminum, and the moderation layer and the covering layer are made of composite of aluminum and ceramic.

12. An electrostatic chucking stage for electro-statically chucking an object as claimed in claim 11, wherein the dielectric plate and the moderation layer are brazed with a brazing material containing aluminum as a main component.

13. An electrostatic chucking stage for electro-statically chucking an object as claimed in claim 11, wherein the dielectric plate and the moderation layer are soldered with solder containing tin as a main component.

14. An electrostatic chucking stage for electro-statically chucking an object as claimed in claim 11, wherein the dielectric plate and the moderation layer are soldered with solder containing lead as a main component.

15. An electrostatic chucking stage for electro-statically chucking an object as claimed in claim 10, wherein the dielectric plate is made of alumina, the chucking electrode is made of aluminum, and the moderation layer and the covering layer are made of composite of aluminum and ceramic.

16. An electrostatic chucking stage for electro-statically chucking an object as claimed in claim 15, wherein the dielectric plate and the moderation layer are brazed with a brazing material containing indium as a main component.

17. A substrate processing apparatus for processing a substrate as the substrate is maintained at a temperature higher than room temperature, comprising an electrostatic chucking stage as claimed in claim 10 for holding the substrate during process.

18. A substrate processing apparatus as claimed in claim 17, comprising a plasma generator for generating plasma at a space facing the substrate, wherein the process utilizes the plasma.

* * * * *

UNITED STATES PATENT AND TRADEMARK OFFICE

CERTIFICATE OF CORRECTION

PATENT NO. : 7,220,319 B2
APPLICATION NO. : 10/413136
DATED : May 22, 2007
INVENTOR(S) : Sago et al.

It is certified that error appears in the above-identified patent and that said Letters Patent is hereby corrected as shown below:

Col. 1, line 9, change “Canon Anelva Corporation, Tokyo (JP)” to Canon Anelva Corporation, Tokyo (JP) and NHK Spring Co., Ltd. Yokohama-shi (JP)

Signed and Sealed this

Second Day of December, 2008

JON W. DUDAS
*Director of the United States Patent and Trademark Office*